US010379580B2

(12) United States Patent
Van Dijke et al.

(10) Patent No.: US 10,379,580 B2
(45) Date of Patent: Aug. 13, 2019

(54) STORAGE MEDIUM ACCOMMODATING APPARATUS, INDUSTRIAL COMPUTER, AND METHOD

(71) Applicant: OMRON Corporation, Kyoto (JP)

(72) Inventors: Casper Van Dijke, Den Bosch (NL); Jeremy Wirkus, Eindhoven (NL); Nard Louws, Gilze (NL)

(73) Assignee: OMRON Corporation, Kyoto (JP)

( * ) Notice: Subject to any disclaimer, the term of this patent is extended or adjusted under 35 U.S.C. 154(b) by 376 days.

(21) Appl. No.: 15/382,757

(22) Filed: Dec. 19, 2016

(65) Prior Publication Data

US 2017/0199551 A1    Jul. 13, 2017

(30) Foreign Application Priority Data

Jan. 8, 2016   (DE) .................. 10 2016 100 237

(51) Int. Cl.
*G06F 1/18* (2006.01)
*H05K 5/02* (2006.01)
(Continued)

(52) U.S. Cl.
CPC .............. *G06F 1/182* (2013.01); *G06F 1/187* (2013.01); *G11B 33/005* (2013.01);
(Continued)

(58) Field of Classification Search
CPC . G06F 1/182; G06F 1/187; G06F 1/16; G11B 33/128; G11B 33/124;
(Continued)

(56) References Cited

U.S. PATENT DOCUMENTS 6,948,967 B2 *   9/2005   Scherer ................ G11B 33/128
                                                              361/727
6,980,430 B2 *   12/2005  Su .......................... G06F 1/184
                                                              312/333
(Continued)

FOREIGN PATENT DOCUMENTS

CN          2791812          6/2006
CN          2842538          11/2006
(Continued)

OTHER PUBLICATIONS

"Office Action of Japan Counterpart Application" with English translation thereof, dated Sep. 19, 2017, p. 1-p. 7, in which the listed references were cited.
(Continued)

*Primary Examiner* — Abhishek M Rathod
(74) *Attorney, Agent, or Firm* — JCIPRNET

(57) ABSTRACT

A storage medium accommodating apparatus for accommodating at least one storage medium of an industrial computer is provided. The accommodating unit includes at least one side wall including at least one guide groove, where the at least one guide groove includes an engagement section; and at least one support unit, where the at least one storage medium may be accommodated inside the at least one support unit, the at least one support unit includes a guide rail that is supported in a manner of being movable on the at least one guide groove, the at least one support unit includes an elastically deformable counter-engagement section, and the counter-engagement section is automatically engaged into the engagement section in a shape-fitting manner in a state that the at least one support unit is pushed into the accommodating unit.

12 Claims, 6 Drawing Sheets

(51) Int. Cl.
*G11B 33/00* (2006.01)
*G11B 33/04* (2006.01)
*H05K 7/18* (2006.01)
*G11B 33/12* (2006.01)

(52) U.S. Cl.
CPC ........ *G11B 33/0422* (2013.01); *G11B 33/124* (2013.01); *G11B 33/128* (2013.01); *H05K 5/0221* (2013.01); *H05K 7/183* (2013.01)

(58) Field of Classification Search
CPC . G11B 33/0422; G11B 33/005; G11B 33/123; G11B 33/127; H05K 5/0221; H05K 7/183; H05K 7/1418
See application file for complete search history.

(56) References Cited

U.S. PATENT DOCUMENTS

| | | | | |
|---|---|---|---|---|
| 7,697,278 B2* | 4/2010 | Peng | ................. | G06F 1/187 248/633 |
| 8,064,195 B2* | 11/2011 | Zhang | ................. | G06F 1/187 211/26 |
| 8,496,493 B2* | 7/2013 | Lin | ................. | G06F 1/187 439/345 |
| 8,544,801 B2* | 10/2013 | Ting | ................. | G06F 1/187 248/220.21 |
| 9,158,347 B2* | 10/2015 | Zhang | ................. | G06F 1/187 |
| 9,172,153 B2* | 10/2015 | Tsai | ................. | G11B 33/124 |
| 2007/0223189 A1* | 9/2007 | Chiang | ................. | G06F 1/187 361/679.33 |
| 2008/0259554 A1* | 10/2008 | Qin | ................. | G06F 1/187 361/679.34 |
| 2008/0265125 A1 | 10/2008 | Ye et al. | | |
| 2009/0141457 A1* | 6/2009 | Fujikawa | ................. | G06F 1/187 361/727 |
| 2011/0032665 A1* | 2/2011 | Huang | ................. | G06F 1/187 361/679.01 |
| 2011/0032670 A1 | 2/2011 | Tsai et al. | | |
| 2012/0273435 A1* | 11/2012 | Liang | ................. | G06F 1/187 211/26 |
| 2013/0314868 A1* | 11/2013 | Tsai | ................. | G11B 33/124 361/679.33 |
| 2014/0022740 A1 | 1/2014 | Tsai et al. | | |
| 2014/0362548 A1* | 12/2014 | Liu | ................. | G06F 1/16 361/754 |
| 2015/0015131 A1 | 1/2015 | Privitera et al. | | |
| 2015/0223364 A1* | 8/2015 | Mundt | ................. | G11B 33/124 174/541 |

FOREIGN PATENT DOCUMENTS

| | | |
|---|---|---|
| CN | 200997100 | 12/2007 |
| CN | 201315040 | 9/2009 |
| CN | 102656958 | 9/2012 |
| JP | H08152937 | 6/1996 |
| JP | 2008124074 | 5/2008 |
| WO | 2008035410 | 3/2008 |

OTHER PUBLICATIONS

"Office Action of China Counterpart Application," dated Jun. 3, 2019, with English translation thereof, p. 1-p. 20.

* cited by examiner

STORAGE MEDIUM ACCOMMODATING APPARATUS, INDUSTRIAL COMPUTER, AND METHOD

CROSS-REFERENCE TO RELATED APPLICATION

This application claims the priority benefit of German application serial no. DE 10 2016 100 237.2, filed on Jan. 8, 2016. The entirety of the above-mentioned patent application is hereby incorporated by reference herein and made a part of this specification.

BACKGROUND OF THE DISCLOSURE

1. Field of the Disclosure

The disclosure relates to a storage medium accommodating apparatus for accommodating at least one storage medium of an industrial computer, an industrial computer including the storage medium accommodating apparatus, and a method for accommodating a storage medium into the storage medium accommodating apparatus of the industrial computer.

2. Description of Related Art

An industrial computer, an industrial personal computer, or an IPC for short refers to a computer used in a task in an industrial field. An industrial computer of such a type includes a firm housing, and the housing, in particular, protects the industrial computer from being affected by an environmental factor (such as dust), electromagnetic interference, and/or moisture. Generally, industrial computers of such a type are applied to process visualization, robot technologies, industrial automation, a test and test bench working mode, or the like. An industrial computer of such a type, with respect to a device in an office area, must be extremely firm and be unlikely to fail. An industrial computer may include a storage medium such as a hard disk, and the storage medium is accommodated in a drawer-shaped support unit and can, together with the support unit, be inserted into a housing of the industrial computer.

US 2011/0032670 A1 describes an apparatus for accommodating a storage medium of a computer. The apparatus includes a guide rail for movably guiding the storage medium. The apparatus further includes a fastening element, which includes a grasping section for drawing out the storage medium from the storage medium.

US 2014/0022740 A1 also describes an apparatus for accommodating a storage medium of a computer. The apparatus includes a guide rail for movably guiding the storage medium and a mechanism for removing the storage medium from the apparatus.

US 2015/0015131 A1 also describes an apparatus for accommodating a storage medium of a computer. The apparatus includes a guide rail for movably guiding the storage medium, a closable door, and an ejection element for ejecting the storage medium.

US 2008/0265125 A1 also describes an apparatus for accommodating a storage medium of a computer. The apparatus includes a V-shaped plate for deflecting cooling air to the storage medium.

SUMMARY OF THE DISCLOSURE

Under abovementioned background, the disclosure is directed to providing a storage medium accommodating apparatus for an industrial computer.

Hence, this disclosure proposes a storage medium accommodating apparatus for accommodating at least one storage medium of an industrial computer. The storage medium accommodating apparatus includes an accommodating unit, the accommodating unit including at least one side wall including at least one guide groove, where the at least one guide groove includes an engagement section; and at least one support unit, where the at least one storage medium may be accommodated inside the at least one support unit, the at least one support unit includes a guide rail that is supported in a manner of being movable on the at least one guide groove, the at least one support unit includes a counter-engagement section which is elastically deformable, and the counter-engagement section is adapted to be automatically engaged into the engagement section in a shape-fitting manner in a state where the at least one support unit is pushed into the accommodating unit.

Being engaged or snapped should be understood as that: the at least one counter-engagement section is engaged or snapped by the at least one engagement section and at least partially engages with the at least one engagement section in a shape-fitting manner. Therefore, a shape-fitting connection, instead of a frictional connection, is established for the support unit and the accommodating unit. The shape-fitting connection is generated by engaging at least two connection objects (which are the engagement section and the counter-engagement section herein) with each other. In this way, the connection objects would not be separated even if there is no force transmission or force transmission is interrupted. In other words, in a situation that a shape-fitting connection exists, one of connection objects hinders another connection objects. Therefore, a connection between the support unit and the accommodating unit can be released only by unlocking the engagement section from counter-engagement section.

The storage medium accommodating apparatus may also be referred to as an accommodating apparatus or an accommodating apparatus for a storage medium. The support unit may be moved from a withdrawn state of being withdrawn partially or completely from the accommodating unit to a pushed-in state. This push-in state is preferably an end position of the support unit. That is, starting from the pushed-in state, the support unit can only be withdrawn again from the accommodating unit, and cannot further move into the accommodating unit. The storage medium is preferably a hard drive or a hard disk. The storage medium accommodating apparatus may include the storage medium. Preferably, multiple (for example, two) support units are disposed, and each support unit accommodates one storage medium.

The support unit is connected to the accommodating unit in a shape-fitting manner, and in this way, it is unnecessary to dispose an additional fastening element such as a screw. In addition, a fast-established and reliable connection can also be implemented between the support unit and the accommodating unit by means of engagement.

According to an implementation manner, the counter-engagement section is disposed on the at least one guide rail. Preferably, the counter-engagement section and the guide rail are formed by a single material. The guide rail preferably includes a head section and a connection section that connects the head section and a side wall of the support unit in a shape-fitting manner. Preferably, the counter-engagement section extends out of the head section.

According to another implementation manner, the counter-engagement section includes a spring section which is elastically deformable and connected to the at least one guide rail.

The spring section is preferably connected to the head section of the guide rail in a single material, manner. The spring section is preferably a leaf spring element. The spring section pre-tensions the counter-engagement section toward the engagement section, so that the counter-engagement section is automatically engaged into the engagement section. The spring section is preferably made of plastic. In particular, the whole support unit is made of plastic. The support unit, for example, may be a plastic injection-molded product that is inexpensive and can be mass-produced.

According to another implementation manner, the counter-engagement section includes a locking element, and the locking element is engaged into the engagement section in a shape-fitting manner in a pushed-in state of the at least one support unit.

The locking element may be a buckle, and the buckle is pressed into the engagement section in the pushed-in state of the support unit. The engagement section may be a recess or a through-hole disposed on the side wall or the guide groove.

According to another implementation manner, the counter-engagement section includes an unlocking element, which is used to disengage the counter-engagement section from the engagement section.

The unlocking element is preferably in a rod shape. By means of an outward movement of the unlocking element, that is, a movement direction opposite to the storage medium, the locking element is separated from the engagement section.

According to another implementation manner, the at least one support unit includes a front wall including a gap, and the unlocking element can be manipulated to pass through the gap.

The unlocking element may be manipulated by means of a tool (a screwdriver) or by means of a removable covering part of the storage medium accommodating apparatus. Hence, the covering part is removed and is enabled to pass through the gap, and by means of the covering part, the locking element is pressed to one side, that is, being pressed to a side backward from the storage medium.

According to another implementation manner, the storage medium accommodating apparatus further includes a covering part, and the covering part is adapted to manipulate the unlocking element and withdraw the at least one support unit from the accommodating unit.

Hence, the covering part may include an engagement section. The engagement section laterally passes through a recess of the gap of the front wall to be guided to the gap. In this way, the engagement section can engage the front wall in a shape-fitting manner and can withdraw the front wall from the accommodating unit by means of the covering part after the at least one support unit is unlocked.

According to another implementation manner, the at least one guide groove includes a first guide groove and a second guide groove, the at least one support unit includes a first support unit and a second support unit, the at least one side wall includes the first guide groove for the first support unit and the second guide groove for the second support unit, and the first guide groove and the second guide groove are disposed in such a way that the first support unit and the second support unit move backward from each other in a process that the support units are pushed into the accommodating unit.

Hence, the guide groove may be of an arc shape or a step shape. The support units move away from each other when they are pushed into the accommodating unit, and in this way, a gap for cooling air to flow is formed between the support units, thereby reliably preventing the storage medium from being overheated.

According to another implementation manner, the at least one side wall includes a first side wall and a second side wall, the accommodating unit includes the first side wall including a first guide groove and a second guide groove and the second side wall including a first guide groove and a second guide groove and disposed opposite to the first side wall, where the first support unit is guided by both sides on the first guide groove, and the second support unit is guided by both sides on the second guide groove.

The side walls may be connected to each other by means of a bottom of the accommodating unit. Preferably, the side walls and the bottom are integrally shaped as a plate-shaped bending part/stamping part. In this way, manufacturing costs can be greatly reduced. The bottom can be fixedly connected to a housing structure (in particular, an accessory accommodating housing) of the industrial computer.

According to another implementation manner, the first guide groove and second guide groove of the second side wall are respectively provided with one engagement section.

Preferably, the guide grooves respectively include a recess disposed in front of the engagement section, and in a process that the guide rail passes through the guide groove, correspondingly, the counter-engagement section may pass through the recess.

According to another implementation manner, a printed circuit board that encloses a back surface of the accommodating unit is disposed between the first side wall and the second side wall, and at least one electronic plug connector for connecting to the at least one storage medium in a plugging manner is disposed on the printed circuit board.

Preferably, multiple (for example, two) electronic plug connectors are disposed, where each storage medium is assigned with one electronic plug connector. The electronic plug connector may be a so-called SATA plug connector. The printed circuit board may also include another electronic plug connector, so as to conveniently connect the printed circuit board to a main board or a mother board of the industrial computer.

According to another implementation manner, the at least one support unit includes a first guiding side wall including a first guide rail and a second guiding side wall including a second guide rail, and the at least one storage medium may be disposed between the first guiding side wall and the second guiding side wall.

Preferably, a counter-engagement section is disposed on the second guide rail. Optionally, a counter-engagement section may also be disposed on the first guide rail. In this case, the guide groove of the first guiding side wall also includes an engagement section. Preferably, the first guiding side wall is connected to the second guiding side wall by means of a supporting section used for supporting the at least one storage medium. The storage medium may be immediately adjacent to the supporting section. The guiding side walls, the front wall, and the supporting section form a frame-shaped geometric structure of the support unit. The storage medium may be tightly clamped between the guiding side walls by means of a fastening element (such as a screw).

The disclosure further proposes an industrial computer including the storage medium accommodating apparatus.

The industrial computer may include a housing apparatus used for disposing the storage medium accommodating apparatus. Further, the industrial computer may include one storage medium or multiple storage mediums.

The disclosure further proposes a method for accommodating a storage medium into a storage medium accommodating apparatus of an industrial computer. The method includes the following steps: accommodating the storage medium into a support unit of the storage medium accommodating apparatus; pushing the support unit together with the storage medium into an accommodating unit of the storage medium accommodating apparatus, where a guide rail of the support unit is guided on a guide groove of a side wall of the accommodating unit; and once the support unit is in a state of being pushed into the accommodating unit, automatically engaging an elastically deformable counter-engagement section of the support unit into an engagement section of the guide groove in a shape-fitting manner.

The method may also include a step of fastening the storage medium to the support unit. By means of the method, multiple support units may be pushed into the accommodating unit.

According to an implementation manner, to unlock the counter-engagement section and the engagement section, a covering part of the storage medium accommodating apparatus is pressed toward the counter-engagement section, so as to disengage the counter-engagement section from the engagement section, and the support unit is withdrawn from the accommodating unit by means of the covering part.

The method may also include a step of removing the covering part from the storage medium accommodating apparatus. The removed covering part is enabled to pass through the gap in the front wall to be guided in, and the unlocking element is pressed to one side, so as to disengage the counter-engagement section from the engagement section. Then, the support unit may be withdrawn from the accommodating unit.

In features or implementation manners described by using embodiments in the preceding or following text, the present disclosure does not explicitly point out some combinations, which include other feasible implementation solutions of the storage medium accommodating apparatus, the industrial computer, and/or the method. An improved or complementary solution proposed by those skilled in the art in an independent aspect form with respect to basic forms of the storage medium accommodating apparatus, the industrial computer, and/or the method also belongs to other feasible implementation solutions of the disclosure.

Reference may be made to the dependent claims and embodiments of the storage medium accommodating apparatus, the industrial computer, and/or the method described in the following for more advantageous design solutions and aspects of the storage medium accommodating apparatus, the industrial computer, and/or the method. The storage medium accommodating apparatus, the industrial computer, and/or the method is described in detail with reference to exemplary implementation manners shown in the accompanying drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Unless otherwise explicitly specified, the same elements or elements having the same function in the accompanying drawings are represented using the same reference numbers.

Figure 1:
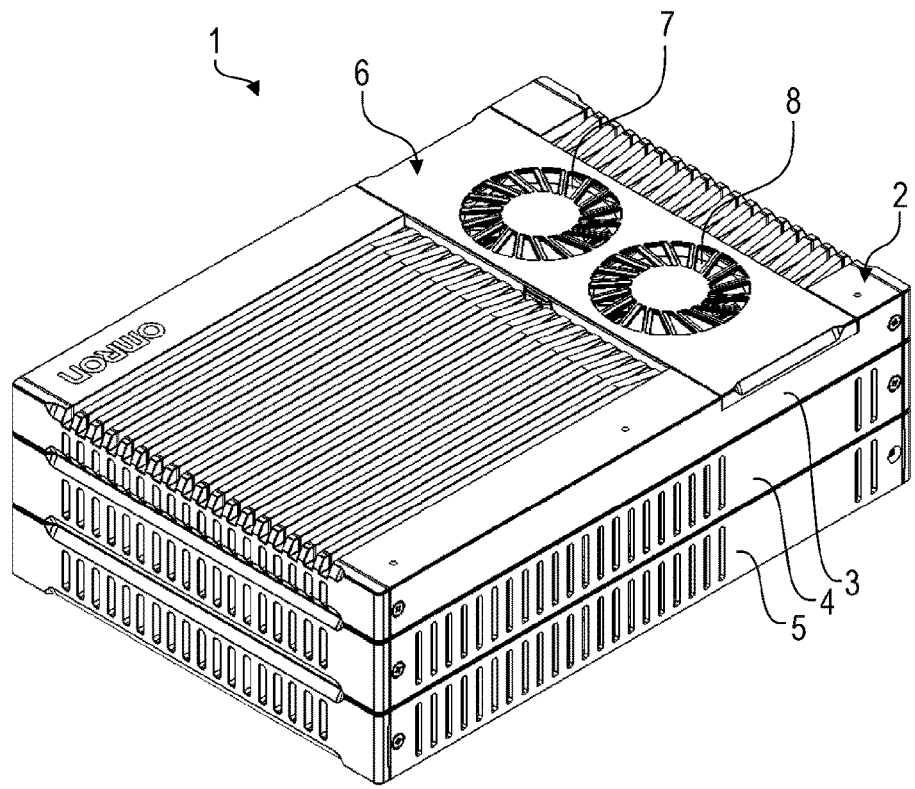
FIG. 1 is a schematic perspective view of an implementation manner of an industrial computer.

FIG. 1 is a schematic perspective view of an implementation manner of an industrial computer. An industrial computer 1, an industrial personal computer, an IPC for short, or industrial Rechner system refers to a computer preferably used in a task in an industrial field, and in particular, to a computer that is similar to an IBM-compatible PC and that, particularly, can work using software directed to devices of this type. Common application scopes of the industrial computer 1 of such a type are process visualization, robot technologies, industrial automation, a test and test bench working mode, security technologies, or quality assurance. The industrial computer 1, with respect to a device in an office area, must satisfy special requirements, is usually not affected by an environmental factor or electromagnetic interference, and is, on the whole, unlikely to fail.

Industrial computer 1 includes a modular housing apparatus 2. The modular housing apparatus 2 refers to an apparatus constructed by multiple units in a modular manner, and the units, particularly, may be separated from each other and connected to each other without using a tool. The housing apparatus 2 herein includes a square cooling housing 3, a square electronic device accommodating housing 4, and at least one square accessory accommodating housing 5. The housing apparatus 2 may include multiple accessory accommodating housings 5 of this type and/or multiple electronic device accommodating housings 4. In orientation of FIG. 1, the electronic device accommodating housing 4 is disposed on the accessory accommodating housing 5, and the cooling housing 3 is disposed on the electronic device accommodating housing 4, so that the electronic device accommodating housing 4 is disposed between the cooling housing 3 and the accessory accommodating housing 5.

The electronic device accommodating housing 4 is adapted to accommodate an electronic component such as a main board or a mother board, a processor or a CPU, or another electronic component of the industrial computer 1. The cooling housing 3 is adapted to cool an electronic component accommodated in the electronic device accommodating housing 4. The accessory accommodating housing 5 is adapted to accommodate an additional component, such as a disk drive, a hard disk, a power supply part, and/or an additional circuit board that can be connected to a main board, of the industrial computer 1. The cooling housing 3, the electronic device accommodating housing 4, and/or the accessory accommodating housing 5 may be made of plastic. The cooling housing 3 includes a cooling unit 6 that can be inserted thereto and removed therefrom. The cooling unit 6 includes multiple fans 7, 8. The number of the fans 7, 8 is random. For example, two fans 7, 8 may be disposed.

Figure 2:
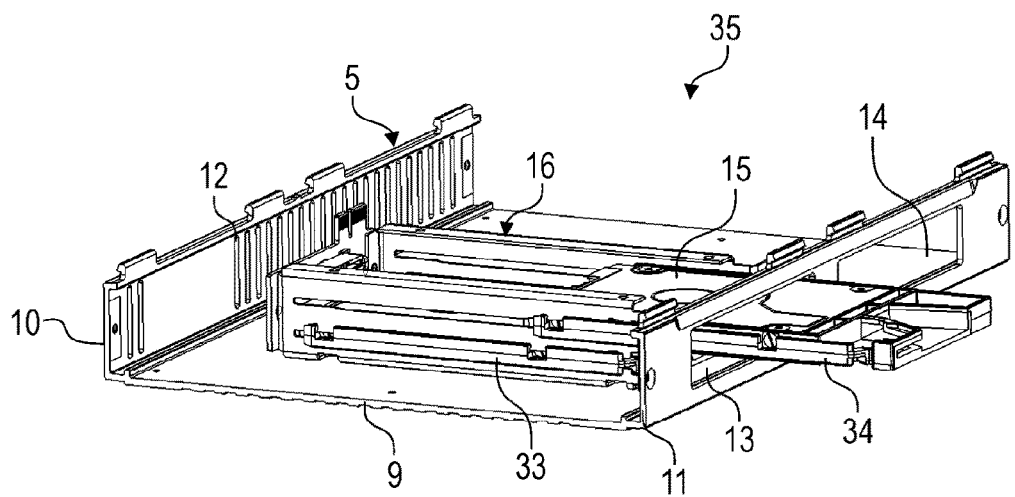
FIG. 2 is a schematic perspective view of an implementation manner of a storage medium accommodating apparatus for the industrial computer shown in FIG. 1.

FIG. 2 is a schematic perspective view of an implementation manner of an accessory accommodating housing 5. The accessory accommodating housing 5 includes a bottom 9 and two side walls 10, 11 that are disposed opposite to each other. The first side wall 10 may include a cooling groove 12. The second side wall 11 includes an opening or a through-hole 13, 14. The accessory accommodating housing 5 may accommodate (for example, two) storage mediums 15, and only one of them is shown in FIG. 2. The storage mediums 15 are vertically stacked. The storage mediums 15 may be hard drives or hard disks.

The storage mediums 15 may store redundant information. That is, the storage mediums 15 form a so-called RAID system. The RAID is an acronym of an English concept "Redundant Array of Independent Disks". A RAID system is used to organize multiple physical mass memories into one logical disk drive, which, as compared with a single physical storage medium, has higher fault security or greater data throughput. A common technology and an application in a computer are directed to preventing redundancy, but the RAID system specially generates redundant information, so that in a case where a single storage medium fails, the RAID, as a whole, keeps completeness and functionality thereof and can restore an initial state by reconstruction after a faulty component is replaced.

Figure 3:
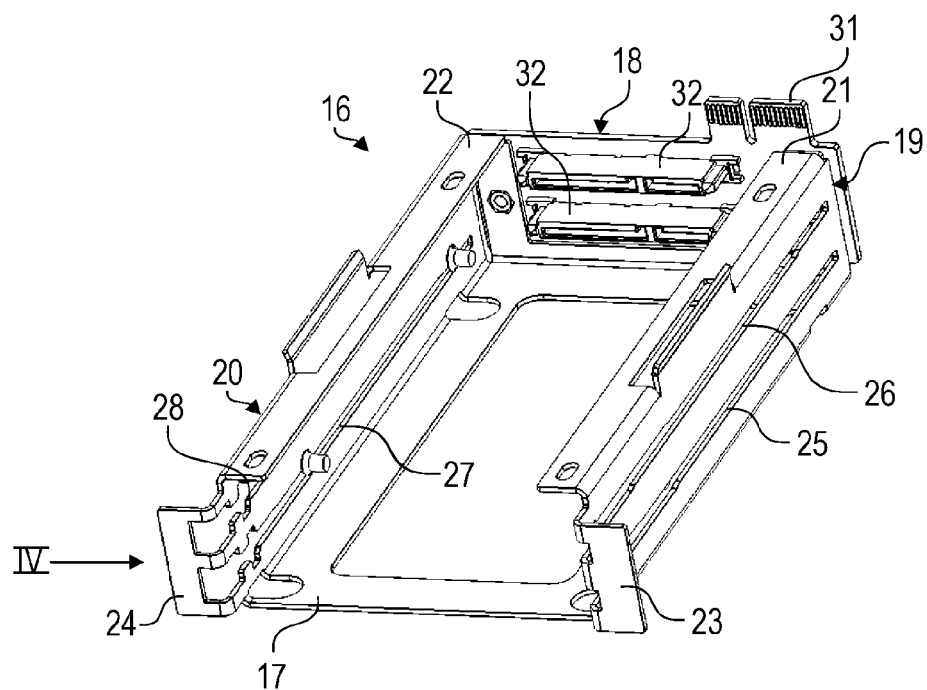
FIG. 3 is a schematic perspective view of an implementation manner of an accommodating unit of the storage medium accommodating apparatus shown in FIG. 2.

An accommodating unit 16 for accommodating storage medium 15 that is also shown in FIG. 3 is disposed in the accessory accommodating housing 5. The accommodating unit 16 has a rectangular bottom 17. The bottom 17 may be in a frame shape and has a recess in the middle. The accommodating unit 16 is further provided with a rear wall constituted by a circuit board or a printed circuit board 18. A first side wall 19 and a second side wall 20 are respectively disposed on edges of the bottom 17. The accommodating unit 16 is enclosed by the printed circuit board 18 on a back surface.

Top surfaces of the side walls 19, 20 are respectively provided with bending portions 21, 22 extending in parallel to the bottom surface 17. Each of the side walls 19, 20 further includes a side section 23, 24, which is perpendicular to the corresponding side wall 19, 20 and is oriented backward from the bottom 17. The first side wall 19 includes a first guide groove 25 and a second guide groove 26 extending backward from the side section 23 and approximately in parallel to the bottom 17. The second side wall 20 also includes a first guide groove 27 and a second guide groove 28. The first guide groove s25, 27 and the second guide grooves 26, 28 are respectively disposed opposite to each other.

Figure 4:
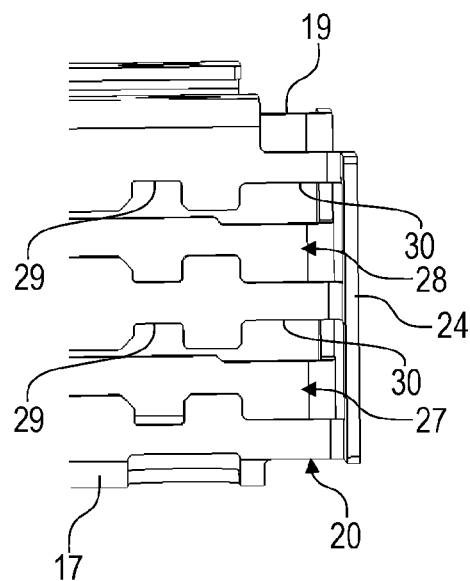
FIG. 4 is a detailed diagram of IV in FIG. 3.

As shown in FIG. 4, the first guide groove 27 and second guide groove 28 of the second side wall 20, on terminals thereof toward the side section 24, respectively includes a first rectangular recess or engagement section 29 and a second rectangular recess 30. With respect to the side section 24, the second recess 30 is disposed between the engagement section 29 and the side section 24. The engagement section 29 and the recess 30 form extensions of the guide grooves 27, 28. The second recess 30 extends into the side section 24. The guide grooves 25, 26 of the first side wall 19 also extend into the side section 23.

The back-surface printed circuit board 18 includes an electronic plug connector 31 used to connect the printed circuit board 18 to another electronic component (such as a main board or a mother board). The printed circuit board 18 is further provided with another electronic plug connector 32 used to connect the printed circuit board 18 to the storage medium 15. The electronic plug connector 32 may be a so-called SATA plug connector. The Serial Advanced Technology Attachment (SATA) is a connection technology developed mainly directed to data exchange between a processor and a hard disk. To mount the accommodating unit 16 onto the accessory accommodating housing 5, the bottom 17 may be connected to the bottom 9 of the accessory accommodating housing 50. In this case, the side sections 23, 24 are directed toward the through-hole 13 disposed in the side wall 11 of the accessory accommodating housing 5.

Figure 5:
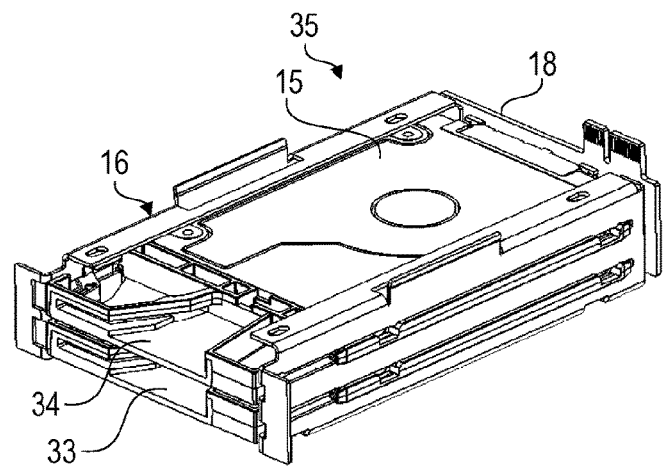
FIG. 5 is another schematic perspective view of the storage medium accommodating apparatus shown in FIG. 2.

The storage medium 15 is accommodated in first and second support units 33, 34, and as shown in FIG. 2 and FIG. 5, the support units may be pushed into and withdrawn from the accommodating unit 16 in a drawer moving manner along the guide grooves 25 to 28. The accommodating unit 16 and the support units 33, 34 form a storage medium accommodating apparatus 35 of the industrial computer 1. The storage medium accommodating apparatus 35 may also include the storage medium 15 or multiple storage mediums 15.

Figure 6:
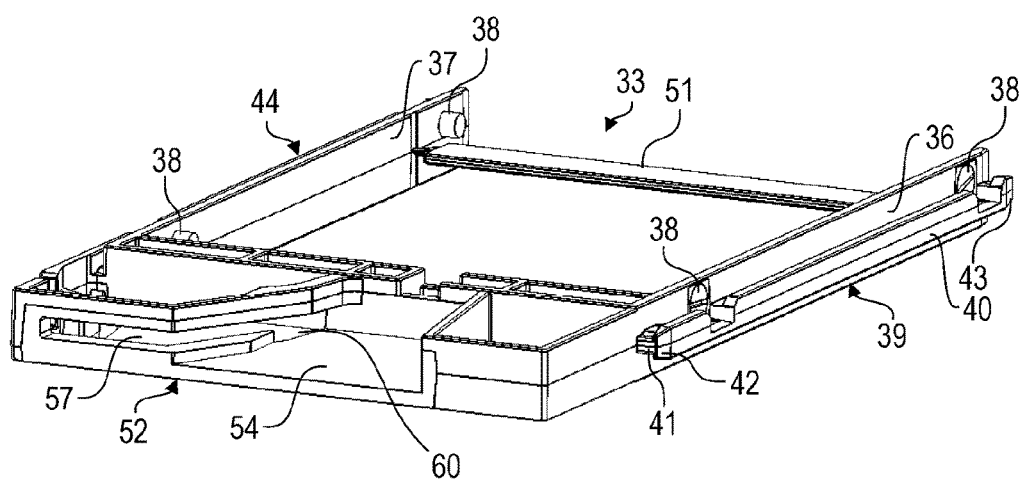
FIG. 6 is a schematic perspective view of an implementation manner of a support unit of the storage medium accommodating apparatus shown in FIG. 2.
Figure 7:
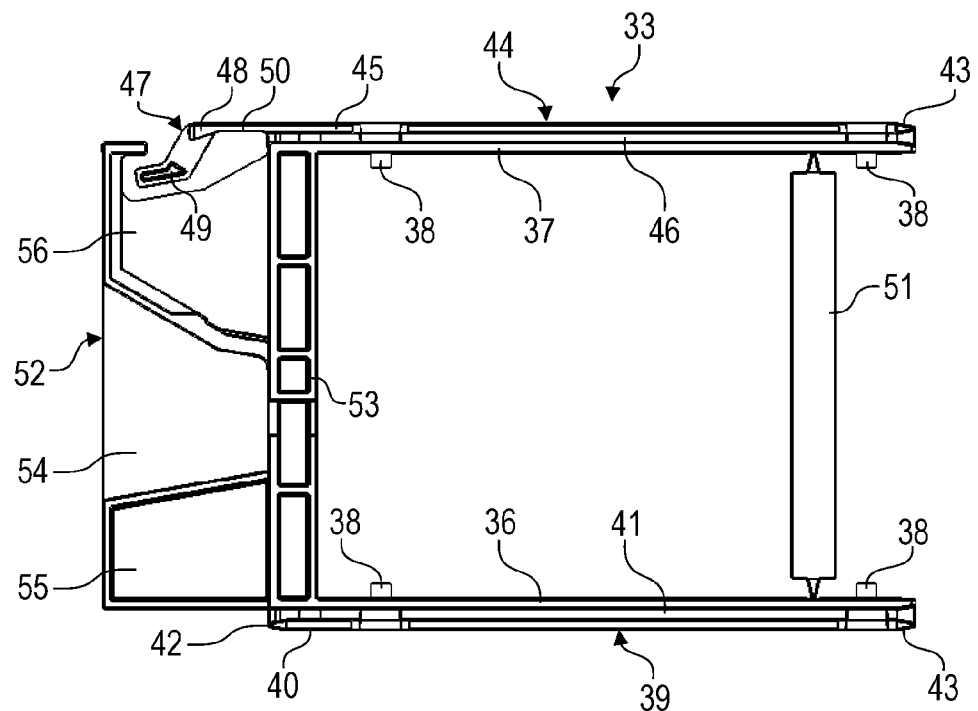
FIG. 7 is a schematic top view of the support unit shown in FIG. 6.

The first support unit 33 and the second support unit 34 have the same structure. Therefore, only the first support unit 33 is described in the following. As shown in FIG. 6 and FIG. 7, the first support unit 33 includes two guiding side walls 36, 37. Each of the guiding side walls 36, 37 is provided with two fastening elements 38. The fastening element 38 may be a threaded screw with an M2.5 thread. The storage medium 15 may be tightly clamped between the guiding side walls 36, 37 by means of the fastening element 38. The first support unit 33 may be made of plastic, for example, made as a plastic injection-molded product.

The first guiding side wall 36 has a first guide rail 39, and the first guide rail includes a head section 40 and a connection section 41 that connects the head section 40 and the first guiding side wall 36. Therefore, the first guide rail 39 includes a mushroom-shaped cross section. The head section 40 further includes guiding-in inclined surfaces 42, 43 disposed on end portions. The second guiding side wall 37 includes a second guide rail 44. The second guide rail 44 also has a head section 45 and a connection section 46 that connects the head section 45 to the second guiding side wall 37.

Figure 8:
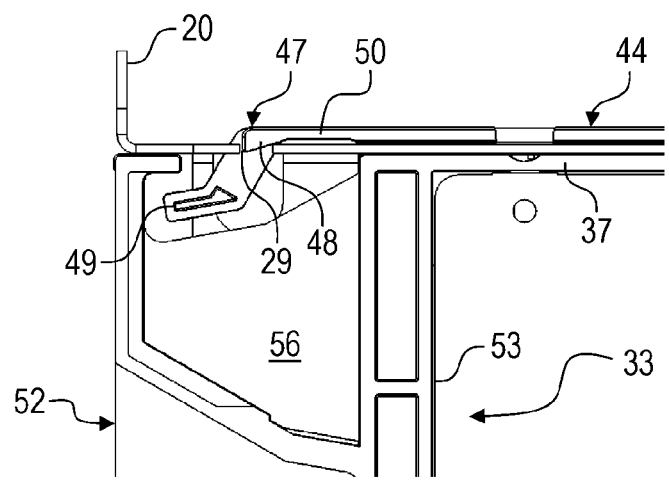
FIG. 8 is another schematic top view of the support unit shown in FIG. 6.

The second guide rail 44 also has a guiding-in inclined surface 43. The second guide rail 44 differs from the first guide rail 39 in that the second guide rail includes elastically deformable locking section or counter-engagement section 47. The counter-engagement section 47 is in a hook shape and is adapted to be engaged into the engagement section 29 of the guide groove 27, 28 in a shape-fitting manner. With regard to this, the counter-engagement section 47 includes a locking element 48, and as shown in FIG. 8, the locking element is engaged into the engagement section 29 in a shape-fitting manner in a state that the first support unit 33 is completely pushed into the accommodating unit 16. The counter-engagement section 47 further includes a rod-shaped unlocking element 49, which is adapted to disengage, when being manipulated the locking element 48 from the engagement section 29. The unlocking element 49 is disposed on the locking element 48. The locking element 48 is integrally connected to the head section 45 by means of an elastically deformable spring section 50.

The first support unit 33 further includes a supporting section 51 that connects the guiding side walls 36, 37 to each other. The supporting section 51 can support the storage medium 15. The first support unit 33 further includes a front wall 52. The front wall 52, the guiding side walls 36, 37, and the supporting section 51 form a frame-shaped geometric structure. The front wall 52 includes a wall section 53 that may be hollow and that is provided with a reinforcing rib. The storage medium 15 may be immediately adjacent to an inner side of the wall section 53, that is, on a side facing the supporting section 51. A front surface of the wall section 53 is provided with a plate-shaped grasping section 54 for grasping the first support unit 33. The grasping section 54 may be in a polygonal shape.

A first cavity 55 and a second cavity 56 are disposed on two sides of the grasping section 54. As shown in FIG. 6 and FIG. 7, the cavities 55, 56 may be exposed toward the top. The cavities 55, 56 may have a reinforcing function. The counter-engagement section 47 is disposed inside the second cavity 56. The second cavity 56 is laterally exposed to help the counter-engagement section 47 to be engaged therein. The front wall 52 and particularly, the second cavity 56 have a gap 57 on the front surface, and the unlocking element 49 may be manipulated to pass through the gap to unlock the locking element 48.

Figure 9:
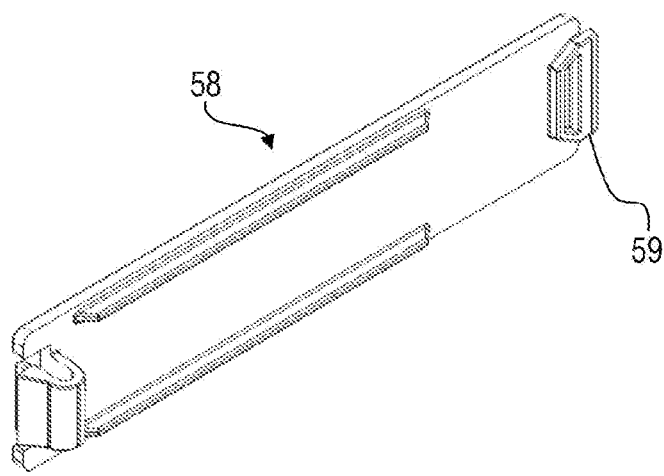
FIG. 9 is a schematic perspective view of an implementation manner of a covering part of the storage medium accommodating apparatus shown in FIG. 2.

A plate-shaped covering part 58 which is front-mounted on the first support unit 33 shown in FIG. 9 may be used to manipulate the unlocking element 49. Hence, the covering part 58 may be removed and enabled to pass through the gap 57, so as to press the unlocking element 49 outward to the second guiding side wall 37. In this way, the locking element 48 is disengaged from the engagement section 29, so as to withdraw the first support unit 33 together with the storage medium 15 from the accommodating unit 16. To withdraw the first support unit 33 from the accommodating unit 16, the covering part 58 may include an engagement section 59. The engagement section 59 laterally passes through a recess 60 (FIG. 6) of the gap 57 to be guided into the gap. In this case, the engagement section 59 is engaged with the front wall 52 in a shape-fitting manner and thus can withdraw the front wall 52 from the accommodating unit 16 by means of the covering part 58 after the first support unit 33 is unlocked.

Figure 10:
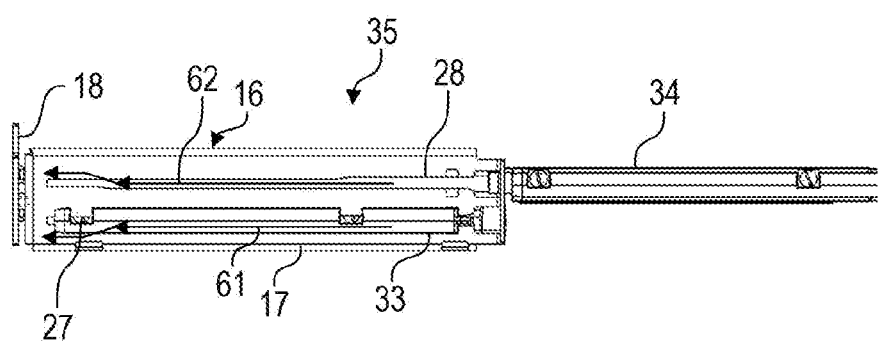
FIG. 10 is a schematic side view of the storage medium accommodating apparatus shown in FIG. 2.

As shown in FIG. 10, the support units 33, 34 are pushed into the accommodating unit 16, so that the storage medium 15 is accommodated inside the storage medium accommodating apparatus 35. The guide inclined surfaces 43 on the guide rails 39, 44 help passing though the guide grooves 25 to 28. The guide grooves 25 to 28 all extend into the side section 23, 24, so that the guide rails 39, 44 can be simply guided into the guide grooves 25 to 28. By means of illustration of an arrow 61 in FIG. 10, the first guide grooves 25, 27 adopt such a specific construction solution that the first support unit 33 moves, when being pushed into the accommodating unit 16, in a direction toward the bottom 17. By means of illustration of the arrow 62 in FIG. 10, the second guide grooves 26, 28 adopt such a specific construction solution that the second support unit 34 moves, when being pushed into the accommodating unit 16, in a direction opposite to the bottom 17. In this way, existence of a space enough for air circulation between the support units 3, 34 is ensured, thereby preventing the storage medium 15 being overheated. Once the support units 33, 34 are completely pushed into the accommodating unit 16, the locking element 48 is engaged into the engagement section 29, and the support units 33, 34 are fixedly disposed inside the accommodating unit 16.

Figure 11:
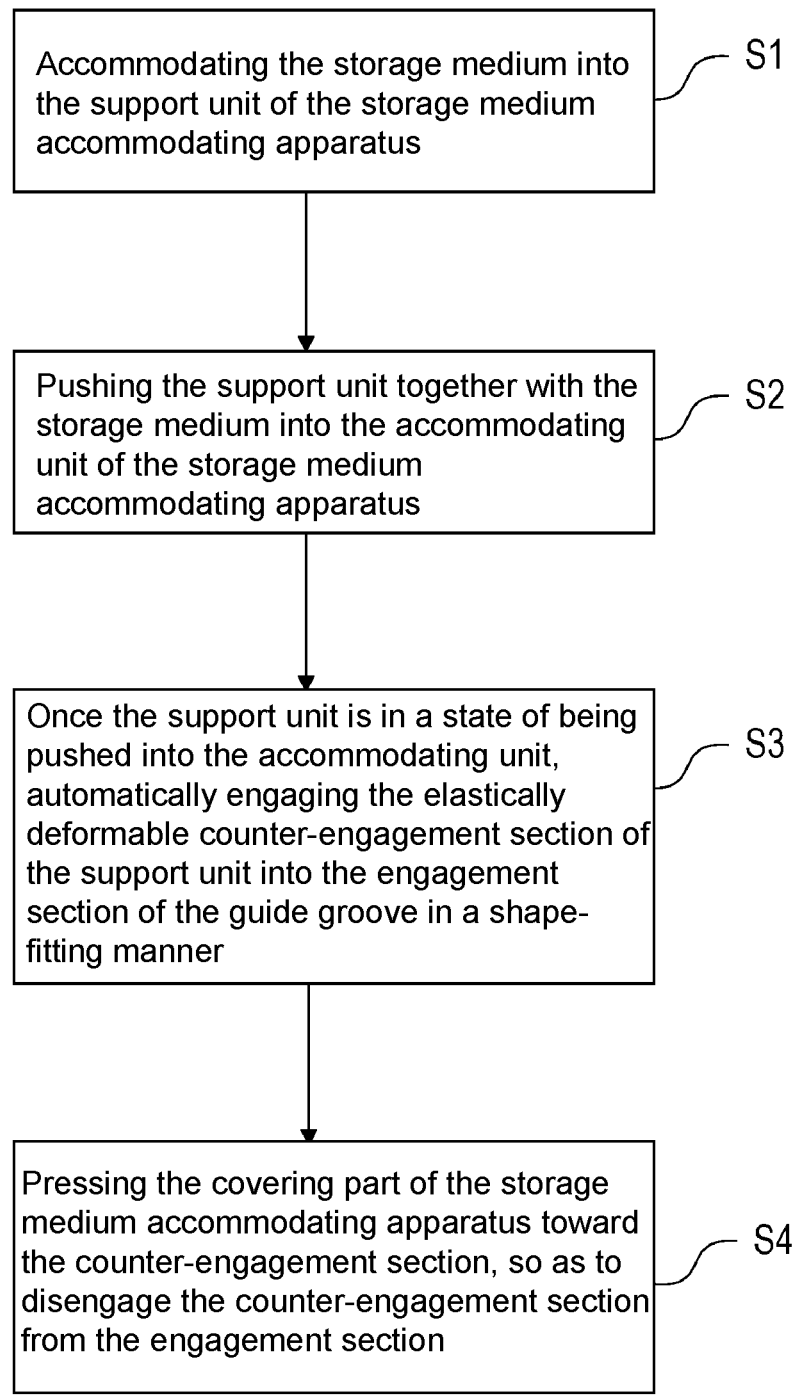
FIG. 11 is a schematic block diagram of an implementation manner of a method for accommodating a storage medium in a storage medium accommodating apparatus of the industrial computer shown in FIG. 1.

FIG. 11 is a schematic block diagram of an implementation manner of a method for accommodating a storage medium 15 or multiple storage mediums 15 in a storage medium accommodating apparatus 35. The method includes a step S1 of accommodating the storage medium 15 or the storage mediums 15 in a corresponding support unit 33, 34 of the storage medium accommodating apparatus 35. The method further includes a step S2 of pushing the support unit 33, 34 together with the corresponding storage medium 15 into an accommodating unit 16, where a second guide rail 44 of the support unit 33, 34 is guided on a guide groove 27, 28 of a side wall 20 of the accommodating unit 16.

The method further includes a step S3: once the corresponding support unit 33, 34 is in a state of being pushed into the accommodating unit 16, automatically engaging the elastically deformable counter-engagement section 47 into a corresponding engagement section 29 of the guide groove 27, 28. The method may also include an optional step S4 of unlocking the counter-engagement section 47 from the engagement section 29 by means of a covering part 58, where the covering part 58 is pressed toward the counter-engagement section 47, so as to disengage the counter-engagement section from the engagement section 29. Any other tool (for example, a screwdriver) may also be applied to step S4.

The disclosure is described with reference to several embodiments, but various modified solutions may also be used in the disclosure.

What is claimed is:

1. A storage medium accommodating apparatus (35) for accommodating at least one storage medium (15) of an industrial computer (1), comprising:
    an accommodating unit (16), the accommodating unit comprising at east one side wall (20) comprising at east one guide groove (27, 28), wherein the at least one guide groove (27, 28) comprises an engagement section (29); and
    at least one support unit (33, 34) comprising a front wall, wherein the at least one storage medium (15) is adapted to be accommodated inside the at least one support unit, the at least one support unit (33, 34) comprises a guide rail (44) that is supported in a manner of being movable on the at least one guide groove, the guide rail comprises a counter-engagement section (47) which is elastically deformable, and the counter-engagement section (47) is adapted to be automatically engaged into the engagement section (29) in a shape-fitting manner in a state wherein the at least one support unit (33, 34) is pushed into the accommodating unit (16), wherein the counter-engagement section comprises an unlocking element configured to disengage the counter-engagement section from the engagement section;
    wherein the front wall comprises a gap and the unlocking element is adapted to manipulate through the gap to disengage the counter-engagement section.

2. The storage medium accommodating apparatus according to claim 1,
    Wherein the counter-engagement section (47) is disposed on the one guide rail (44).

3. The storage medium accommodating apparatus according to claim 2, wherein the counter-engagement section (47) comprises a spring section (50) which is elastically deformable and connected to the at least one guide rail (44).

4. The storage medium accommodating apparatus according to claim 1, wherein the counter-engagement section (47) comprises a locking element (48), and the locking element is engaged into the engagement section (29) in a shape-fitting manner in a pushed-in state of the at least one support unit (33, 34).

5. The storage medium accommodating apparatus according to claim 1, further comprising a covering part (58), wherein the covering part is adapted to manipulate the unlocking element (49) and withdraw the at least one support unit (33, 34) from the accommodating unit (16).

6. The storage medium accommodating apparatus according to claim 1, wherein the at least one guide groove (27, 28) comprises a first guide groove (27) and a second guide groove (28), the at least one support unit (33, 34) comprises a first support unit (33) and a second support unit (34), the at least one side wall (20) comprises the first guide groove (27) for the first support unit (33) and the second guide groove (28) for the second support unit (34), and the first guide groove (27) and the second guide groove (28) are disposed in such a way that the first support unit (33) and the second support unit (34) move away from each other in a process that the first support unit (33) and the second support unit (34) are pushed into the accommodating unit (16).

7. The storage medium accommodating apparatus according to claim 6, wherein the at least one side wall (20) comprises a first side wall (19) and a second side wall (20), the accommodating unit (16) comprises the first side wall (19) comprising the first guide groove (25) and the second guide groove (26) and the second side wall (20) comprising the first guide groove (27) and the second guide groove (28) and disposed opposite to the first side wall (19), wherein the first support unit (33) is guided by both sides on the first guide groove (25, 27), and the second support unit (34) is guided by both sides on the second guide groove (26, 28).

8. The storage medium accommodating apparatus according to claim 7, wherein the first guide groove (27) and the second guide groove (28) of the second side wall (20) are respectively provided with one engagement section (29).

9. The storage medium accommodating apparatus according to claim 7, wherein a printed circuit board (18) that encloses a back surface of the accommodating unit (16) is disposed between the first side wall (19) and the second side wall (20), and at least one electronic plug connector (32) for connecting to the at least one storage medium (15) in a plugging manner is disposed on the printed circuit board.

10. The storage medium accommodating apparatus according to claim 1, wherein the at least one support unit (33, 34) comprises a first guiding side wall (36) comprising a first guide rail (39) and a second guiding side wall (37) comprising a second guide rail (44), and the at least one storage medium (15) is adapted to be disposed between the first guiding side wall (36) and the second guiding side wall (37).

11. An industrial computer (1), comprising the storage medium accommodating apparatus (35) according to claim 1.

12. A method for accommodating a storage medium (15) into a storage medium accommodating apparatus (35) of an industrial computer (1), comprising the following steps:
    accommodating (S1) the storage medium (15) into a support unit (33, 34) of the storage medium accommodating apparatus (35);
    pushing (S2) the support unit (33, 34) together with the storage medium (15) into an accommodating unit (16) of the storage medium accommodating apparatus (35), wherein a guide rail (44) of the support unit (33, 34) is guided on a guide groove (27, 28) of a side wall (20) of the accommodating unit (16); and
    once the support unit (33, 34) is in a state of being pushed into the accommodating unit (16), automatically engaging (S3) a counter-engagement section (47) which is elastically deformable of the support unit (33, 34) into an engagement section (29) of the guide groove (27, 28) in a shape-fitting manner;
    wherein the counter-engagement section comprises an unlocking element configured to disengage the counter engagement section from the engagement section;
    wherein a front wall of the support unit comprises a gap;
    wherein: to unlock (S4) the counter-engagement section (47) and the engagement section (29), a covering part (58) of the storage medium accommodating apparatus (35) is pressed toward the unlocking element of the counter-engagement section (47) by passing through the gap of the front wall, so as to disengage the counter-engagement section from the engagement section (29), and the support unit (33, 34) is withdrawn from the accommodating unit (16) by means of the covering part (58).

* * * * *